(12) United States Patent
Akaike et al.

(10) Patent No.: US 7,261,596 B2
(45) Date of Patent: Aug. 28, 2007

(54) SHIELDED SEMICONDUCTOR DEVICE

(75) Inventors: Sadakazu Akaike, Nagano (JP); Akinobu Inoue, Nagano (JP); Atsunori Kajiki, Nagano (JP); Hiroyuki Takatsu, Nagano (JP); Takashi Tsubota, Nagano (JP); Norio Yamanishi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/318,674

(22) Filed: Dec. 27, 2005

(65) Prior Publication Data

US 2006/0148317 A1    Jul. 6, 2006

(30) Foreign Application Priority Data

Jan. 5, 2005   (JP)   ............................. 2005-000714

(51) Int. Cl.
  *H01R 13/648*   (2006.01)
(52) U.S. Cl. ..................................................... 439/607
(58) Field of Classification Search .................. 439/66, 439/70, 607, 55, 519, 525; 174/250, 522; 361/800
   See application file for complete search history.

(56) References Cited

U.S. PATENT DOCUMENTS

| | | | | |
|---|---|---|---|---|
| 5,703,753 | A  * | 12/1997 | Mok ........................... | 361/715 |
| 6,053,771 | A  * | 4/2000  | Hood et al. .................. | 439/607 |
| 6,471,525 | B1 * | 10/2002 | Fan et al. ..................... | 439/70  |
| 6,600,101 | B2 * | 7/2003  | Mazurkiewicz ............. | 174/388 |
| 6,932,618 | B1 * | 8/2005  | Nelson ........................ | 439/66  |
| 6,942,494 | B2 * | 9/2005  | Watson ....................... | 439/66  |
| 7,109,410 | B2 * | 9/2006  | Arnold et al. .............. | 174/522 |
| 2004/0231872 | A1* | 11/2004 | Arnold et al. ............ | 174/35 R |
| 2004/0240191 | A1* | 12/2004 | Arnold et al. ............. | 361/800 |
| 2004/0245015 | A1* | 12/2004 | Yoshimi et al. ............. | 174/263 |
| 2005/0045369 | A1* | 3/2005  | Ishimaru et al. ............ | 174/250 |

FOREIGN PATENT DOCUMENTS

JP   2001 267628   9/2001

* cited by examiner

*Primary Examiner*—Chandrika Prasad
(74) *Attorney, Agent, or Firm*—Ladas & Parry LLP

(57) ABSTRACT

A semiconductor device is disclosed that comprises a board, a ground terminal disposed on the board, a connection terminal disposed on the board, a semiconductor chip mounted on the board, and a shield member electrically connected to the ground terminal. The semiconductor chip, the ground terminal, and the connection terminal are disposed on one side of the board, and the shield member is disposed directly on and covers the other side of the board.

6 Claims, 16 Drawing Sheets

SHIELDED SEMICONDUCTOR DEVICE

BACKGROUND OF THE INVENTION

1. Field of the Invention

The present invention generally relates to a semiconductor device, and particularly relates to a semiconductor device including a shield member.

2. Description of the Related Art

Semiconductor devices including shield cases for protecting electronic components mounted on boards from electromagnetic waves have been known in the art. FIG. 1 is a cross-sectional view illustrating a related-art semiconductor device 10 including a shield case 40, wherein H1 represents the height of a potting resin section 35 (hereinafter referred to as "height H1"), H2 represents the height of the semiconductor device 10 (hereinafter referred to as "height H2"), and A represents a clearance between the potting resin section 35 and the shield case 40 (hereinafter referred to as "clearance A").

With reference to FIG. 1, the semiconductor device 10 generally comprises a board 11, electronic components 26, a semiconductor chip 31, the potting resin section 35, connection terminals 38, ground terminals 39, and the shield case 40. The board 11 generally comprises a substrate 12, through vias 13, connection portions 14 and 15, seal rings 16, solder resists 17 and 24, wiring portions 21, and ground terminal pads 23. The through via 13 extend through the substrate 12 to allow electrical connections between the connection portions 14, 15 and the wiring portions 21 and between the seal rings 16 and ground terminal pads 23.

The connection portions 14 and 15 are formed on an upper face 12A of the substrate 12 and are electrically connected to the corresponding through vias 13. The connection portions 14 are electrically connected to the semiconductor chip 31 through metal wires 34. The connection portions 15 are electrically connected to the electronic components 26. The seal rings 16 are disposed outside an area of the substrate 12 where the electronic components 26 and the semiconductor chip 31 are mounted. The seal rings 16 are electrically connected to the shield case 40. The solder resist 17 is formed on the upper face 12A of the substrate 12 so as to provide insulation between the connection portions 14 and 15.

The wiring portions 21 include connection pads 22 on which the connection terminals 38 are disposed. The wiring portions 21 are formed on a lower face 12B of the substrate 12 and electrically connected to the corresponding through vias 13. The ground terminal pads 23, on which the ground terminals 39 are disposed, are formed on the lower face 12B of the substrate 12 and electrically connected to the seal rings 16 through the corresponding through vias 13. The solder resist 24 is formed across the lower face 12B of the substrate 12, covering the wiring portions 21 but exposing the connection pads 22 of wiring portions 21 and the ground terminal pads 23.

Each electronic component 26 has one function of basic electric elements such as transistors, diodes, resistors, and capacitors. The electronic components 26 are electrically connected to the connection portions 15 through application of solder paste 27.

The semiconductor chip 31 is mounted on the upper face 12A of the substrate 12 through an adhesive 25. The semiconductor chip 31 includes electrode pads 33 that are electrically connected to the connection portions 14 through the metal wires 34. The semiconductor chip 31 is covered with the potting resin section 35, which is formed by potting resin, for protecting the metal wires 34.

The connection terminals 38 are external connection terminals to be connected to another board such as a motherboard. The connection terminals 38 are disposed on the corresponding connection pads 22. The ground terminals 39 have ground potential and are disposed on the corresponding ground terminal pads 23.

The shield case 40 covers the electronic components 26 and the semiconductor chip 31 and has an electrical connection to the seal rings 16 through application of solder paste 37 (see, for example, Patent Document 1). The electronic component 26 and the semiconductor chip 31 are protected from electromagnetic waves by having the shield case 40 in the manner described above.

[Patent Document 1] Japanese Patent Laid-Open Publication No. 2001-267628

A problem with the semiconductor device 10 is that it is not easy to locate the shield case 40 on the board 11. This is because since the semiconductor chip 31 is encapsulated by the potting resin section 35 formed by potting resin, the shield case 40 needs to be located so as to provide a clearance between the potting resin section 35 and the shield case 40 in order to prevent the shield case 40 from pressing a projecting part of the potting resin section 35. Another problem with the semiconductor device 10 is that the size thereof cannot be reduced because the shield case 40 is disposed on the board 11 with the clearance A.

SUMMARY OF THE INVENTION

The present invention may solve at least one problem described above. An object of the present invention is to provide a semiconductor device with reduced size in which a shield member can be mounted easily.

According to one aspect of the present invention, there is provided a semiconductor device that comprises a board, a ground terminal disposed on the board, a connection terminal disposed on the board, a semiconductor chip mounted on the board, and a shield member electrically connected to the ground terminal, wherein the semiconductor chip, the ground terminal, and the connection terminal are disposed on one side of the board, and wherein the shield member is disposed directly on and covers the other side of the board.

Since the semiconductor chip, the ground terminal, and the connection terminal are disposed on one side of the board, the shield member can be disposed directly on and cover the other side of the board. This configuration can reduce the size of the semiconductor device and allows easier mounting of the shield member on the board.

In the above-described semiconductor device, it is preferable that the semiconductor chip be covered with a transfer molded resin section, and the ground terminal and the connection terminal be exposed from the transfer molded resin section.

Since the ground terminal and the connection terminal are exposed from the transfer molded resin section covering the semiconductor chip, the ground terminal and the connection terminal can be electrically connected to another board such as a motherboard.

In the above-described semiconductor device, it is also preferable that the ground terminal and the connection terminal have flat faces exposed from the transfer molded resin section, and the flat faces of the ground terminal and the connection terminal be substantially flush with a face of the transfer mold resin.

With this configuration, the semiconductor device can be accurately mounted on another board such as a motherboard.

According to another aspect of the present invention, there is provided a semiconductor device that comprises a board, a ground terminal disposed on the board, a connection terminal disposed on the board, a semiconductor chip mounted on the board, and a shield member, wherein the connection terminal is disposed on one side of the board while the ground terminal is disposed on the other side of the board, and wherein the shield member is disposed on the ground terminal.

This configuration can reduce the size of the semiconductor device and allows easier mounting of the shield member on the ground terminal.

In the above-described semiconductor device, it is preferable that the semiconductor chip be covered with a transfer molded resin section, and the ground terminal be exposed from the transfer molded resin section.

Since the ground terminal is exposed from the transfer molded resin section, the ground terminal can be electrically connected to the shield member.

In the above-described semiconductor device, it is also preferable that the ground terminal have a flat face exposed from the transfer molded resin section, and the flat face of the ground terminal be substantially flush with a face of the transfer mold resin.

Since the flat face of the ground terminal exposed from the transfer molded resin section is substantially flush with the face of the transfer molded resin section, the shield member can be easily mounted on the ground terminal.

DETAILED DESCRIPTION OF THE PREFERRED EMBODIMENT

The following description provides exemplary embodiments of the present invention with reference to the accompanying drawings.

First Embodiment

Figure 1:
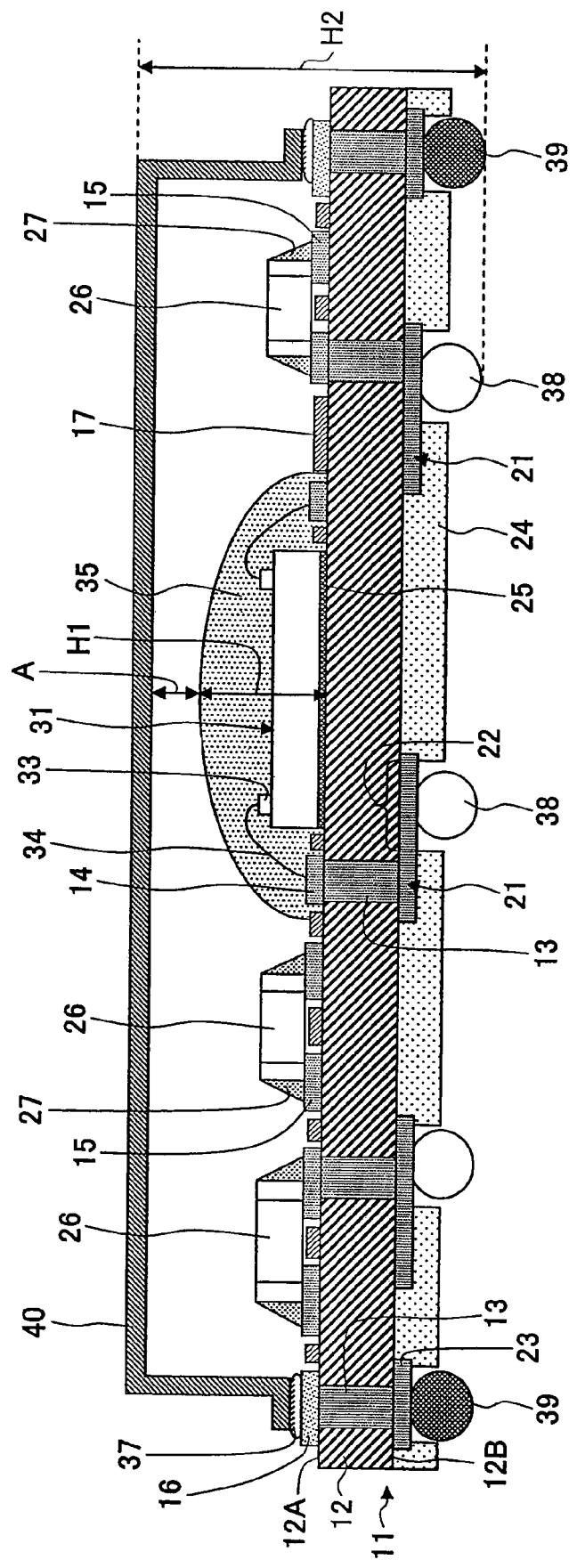
FIG. 1 is a cross-sectional view illustrating a related-art semiconductor device including a shield case.
Figure 2:
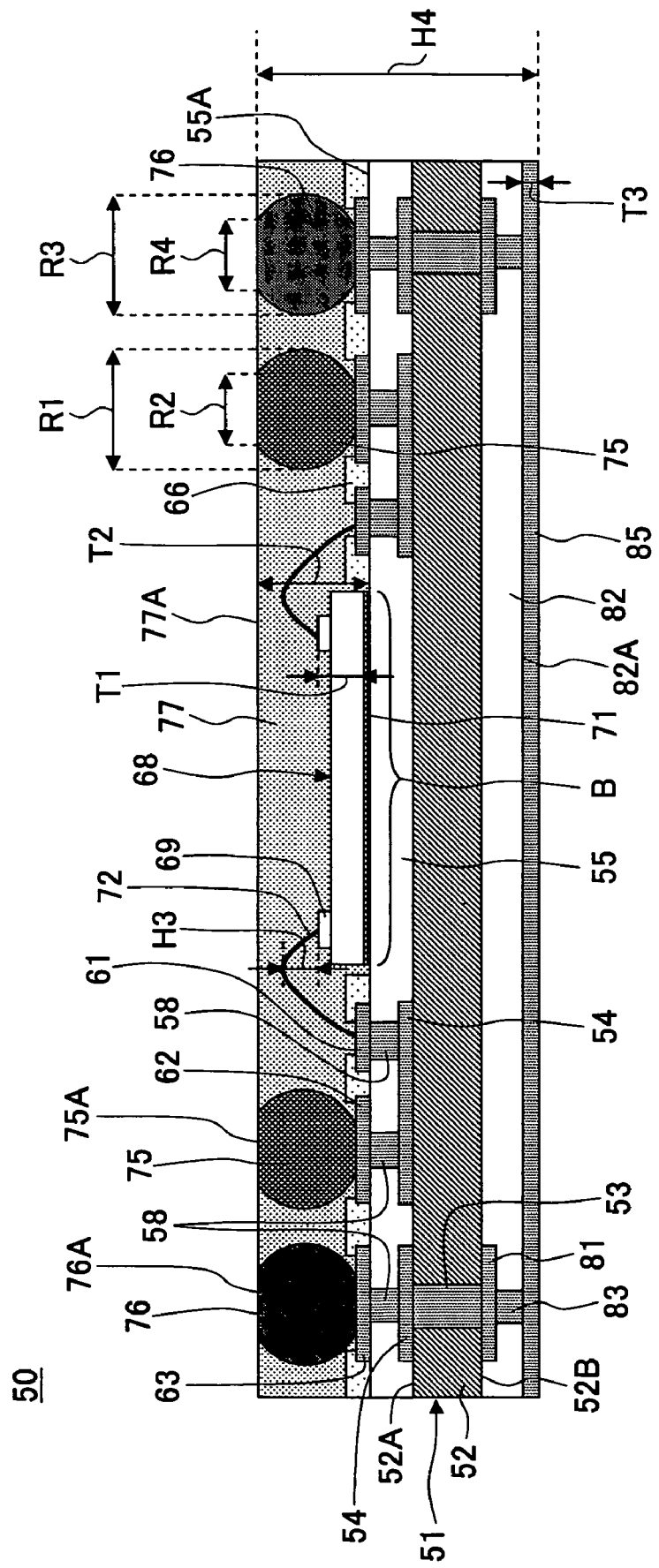
FIG. 2 is a cross-sectional view illustrating a semiconductor device according to a first embodiment of the present invention.
Figure 3:
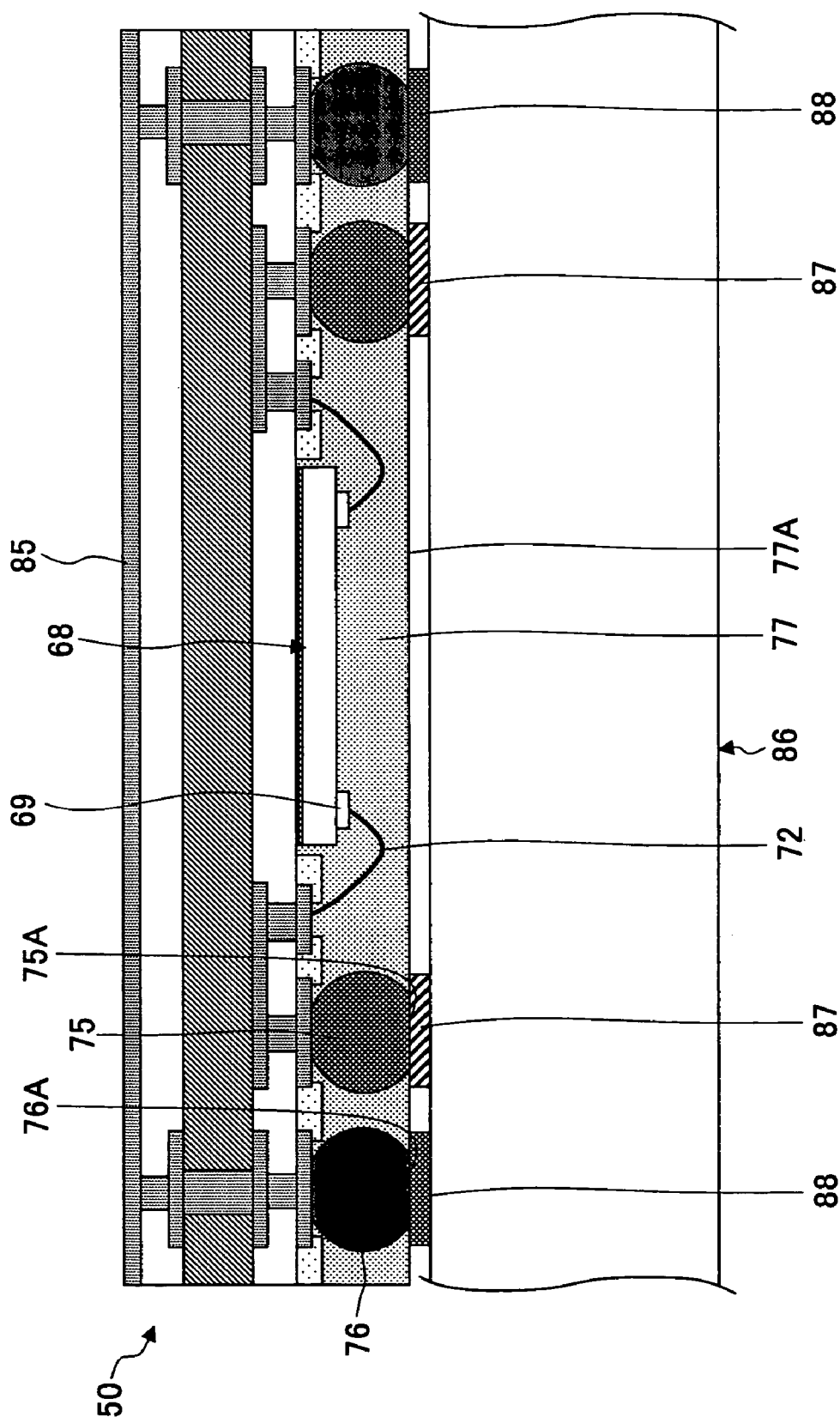
FIG. 3 is a cross-sectional view illustrating the semiconductor device of the first embodiment connected to a motherboard.

A semiconductor device 50 is described below with reference to FIGS. 2 and 3 according to a first embodiment of the present invention. FIG. 2 is a cross-sectional view illustrating the semiconductor device 50 according to the first embodiment of the present invention, wherein B represents an area on an upper resin layer 55 where a semiconductor chip 68 is mounted (hereinafter referred to as "chip mount area B"), H3 represents the height of wires 72 with reference to electrode pads 69 (hereinafter referred to as "height H3"), H4 represents the height of the semiconductor device 50 (hereinafter referred to as "height H4"), R1 represents the diameter of a generally spherical part of each connection terminal 75 (hereinafter referred to as "diameter R1"), R2 represents the diameter of a flat face 75A of each connection terminal 75 exposed from a transfer molded resin section 77 (hereinafter referred to as "diameter R2"), R3 represents the diameter of a generally spherical part of each ground terminal 76 (hereinafter referred to as "diameter R3"), R4 represents the diameter of a flat face 76A of each ground terminal 76 exposed from the transfer molded resin section 77 (hereinafter referred to as "diameter R4"), T1 represents the thickness of the semiconductor chip 68 including the electrode pad 69 (hereinafter referred to as "thickness T1"), T2 represents the thickness of the transfer molded resin section 77 with reference to an upper face 55A of the upper resin layer 55 (hereinafter referred to as "thickness T2"), and T3 represents the thickness of a shield member 85 (hereinafter referred to as "thickness T3"). FIG. 3 is a cross-sectional view illustrating the semiconductor device 50 connected to a motherboard 86.

The semiconductor device 50 generally comprises a board 51, the semiconductor chip 68, the connection terminals 75, the ground terminals 76, the transfer molded resin section 77, and the shield member 85. The board 51 generally comprises a substrate 52, through vias 53, upper wiring portions 54, the upper resin layer 55, vias 58 and 83, wire connection portions 61, connection pads 62 and 63, solder resist 66, lower wiring portions 81, and the lower resin layer 82.

The substrate 52 is a plate member. The substrate 52 may be, for example, a resin substrate or a ceramic substrate. The through vias 53 extend through the substrate 52 to allow electrical connections between the upper wiring portions 54 and the lower wiring portions 81.

The upper wiring portions 54 are formed on an upper face 52A of the substrate 52 and electrically connected to the corresponding through vias 53. The upper resin layer 55 is formed to cover the upper wiring portions 54 and the upper face 52A of the substrate 52. The chip mount area B where the semiconductor chip 68 is mounted is formed on the upper resin layer 55. The vias 58 are provided in the upper resin layer 55. Each via 58 is connected at one end to the upper wiring portion 54 and at the other end to one of the wire connection portion 61, the connection pad 62, and the connection pad 63.

The wire connection portions 61, to which the wires 72 connected to the semiconductor chip 68 are connected, are formed on the upper face 55A of the upper resin layer 55 and electrically connected to the corresponding vias 58. The connection pads 62, on which the connection terminals 75 are disposed, are formed on the upper face 55A of the upper resin layer 55 and electrically connected to the corresponding vias 58. The connection pads 63, on which the ground terminals 76 are disposed, are formed on the upper face 55A of the upper resin layer 55 and electrically connected to the corresponding vias 58. The solder resist 66 is formed to cover the upper face 55A of the upper resin layer 55 with the wire connection portions 61 and the connection pads 62 and 63 exposed.

The lower wiring portions 81 are disposed on a lower face 52B of the substrate 52 and electrically connected to the corresponding through vias 53. The lower resin layer 82 is formed to cover the lower wiring portions 81 and the lower face 52B of the substrate 52. The vias 83 are provided in the lower resin layer 82. Each via 83 is connected at one end to the corresponding lower wiring portion 81 and at the other end to the shield member 85.

The semiconductor chip 68 is mounted on the chip mount area B on the upper resin layer 55 through an adhesive 71. The semiconductor chip 68 includes the electrode pads 69 that are electrically connected to the wire connection portions 61 through the wires 72. The thickness T1 of the semiconductor chip 68 may be, for example, 0.15 mm. Non-exclusive examples of the wires 72 include metal wires. The height H3 of each wire 72 may be, for example, 0.1 mm. The semiconductor chip 68 and the wires 72 are encapsulated by the transfer molded resin section 77 with a transfer molding method. In a transfer molding method, generally, an object to be encapsulated (the board 51 on which the semiconductor chip 68, the connection terminals 75, and the ground terminals 76 are mounted in the case of this embodiment) is placed in a die molding machine, and resin softened by heat is forced into a die and shaped in the form of the die.

The thickness of the transfer molded resin section 77 is more easily controlled due to the use of the transfer molding method compared to the potting resin section 35. Moreover, the time taken for resin encapsulating is reduced, thereby increasing the productivity of manufacturing the semiconductor device 50. The thickness T2 of the transfer molded resin section 77 may be, for example, 0.3 mm.

Each connection terminal 75 is a generally spherical conductor including the flat face 75A, and is disposed on the corresponding connection pad 62. The flat face 75A of the connection terminal 75 is exposed from the transfer molded resin section 77 and flush with a face 77A of the transfer molded resin section 77. The connection terminal 75 is an external connection terminal to be electrically connected to, for example, another board such as the motherboard 86, and is formed to extend upward relative to the wires 72. As shown in FIG. 3, each connection terminal 75 is connected to a corresponding connection pad 87 formed on the motherboard 86 when the semiconductor device 50 is connected to the motherboard 86.

Non-exclusive examples of the connection terminal 75 include a solder ball and a metal post having a columnar or prismatic shape. If a metal post is used as the connection terminal 75, the metal post may be formed by soldering a post made of, for example, copper, to the corresponding connection pad 62, or may be formed by depositing and growing a plating film on the corresponding connection pad 62. If a solder ball is used as the connection terminal 75, the solder ball may be formed such that the diameter R1 of the generally spherical part of the connection terminal 75 is, for example, 0.4 mm and the diameter R2 of the flat face 75A is, for example, 0.25 mm.

Each ground terminal 76 is a generally spherical conductor including the flat face 76A, and is disposed on the corresponding connection pad 63. The flat face 76A of the ground terminal 76 is exposed from the transfer molded resin section 77 and flush with the face 77A of the transfer molded resin section 77. The ground terminals 76 are conductors having ground potential. As shown in FIG. 3, each ground terminal 76 is connected to a corresponding connection pad 88 formed on the motherboard 86 when the semiconductor device 50 is connected to the motherboard 86.

Non-exclusive examples of the ground terminal 76 include a solder ball and a metal post having a columnar or prismatic shape. If a metal post is used as the ground terminal 76, the metal post may be formed by soldering a post made of, for example, copper, to the corresponding connection pad 63, or may be formed by depositing and growing a plating film on the corresponding connection pad 63. If a solder ball is used as the ground terminal 76, the solder ball may be formed such that the diameter R3 of the generally spherical part of the ground terminal 76 is, for example, 0.4 mm and the diameter R4 of the flat face 76A is, for example, 0.25 mm.

In the illustrated embodiment, as the semiconductor chip 68, the connection terminals 75, and the ground terminals 76 are disposed on one side of the board 51 (the upper face side of the board 51), there is a space for disposing the shield member 85 on the other side of the board 51 (the lower face side of the board 51). Further, the accuracy for mounting the semiconductor device 50 to another board such as the motherboard 86 is improved because the faces 75A of the connection terminals 75 and the faces 76A of the ground terminals 76 are flat and substantially flush with the face 77A of the transfer molded resin section 77.

The shield member 85 is electrically connected to the ground terminals 76 so as to reduce adverse effects of electromagnetic waves and the like. The shield member 85 is disposed directly on a face 82A of the lower resin layer 82 so as to cover the face 82A. The shield member 85 is electrically connected to the vias 83. The shield member 85 is fixed to the lower resin layer 82 with use of, for example, conductive adhesive or solder (neither shown). The shield member 85 may be, for example, a copper foil or a copper plating layer. An Au layer may be formed as a protective film on the copper plating layer. The thickness T3 of the shield member 85 may range, for example, from 10 μm to 30 μm.

Unlike the related-art semiconductor device 10 in which the clearance A between the potting resin section 35 and the shield case 40 needs to be considered, the shield member 85 can be directly disposed on the face 82A of the lower resin layer 82 without such consideration, and therefore the shield member 85 can be easily disposed on the board 51. Moreover, since the shield member 85 is directly disposed on the face 82A of the lower resin layer 82, the size of the semiconductor device 50 can be reduced.

As mentioned above, the semiconductor chip 68, the connection terminals 75, and the ground terminals 76 are disposed on one side of the board 51 (the upper face side of the board 51), and the shield member 85 is directly disposed on the face 82A of the lower resin layer 82, which is formed on the other side of the board 51 (the lower face side of the board 51), to cover the face 82A. This configuration can reduce the height H4 of the semiconductor device 50 and accordingly reduce the size of the semiconductor device 50. Moreover, this configuration allows easier mounting of the shield member 85 on the board 51. Electronic components and other semiconductor chips (e.g. flip-chip connected semiconductor chips) may be mounted on the upper face side of the board 51 on which the semiconductor chip 68 is mounted.

Figure 4:
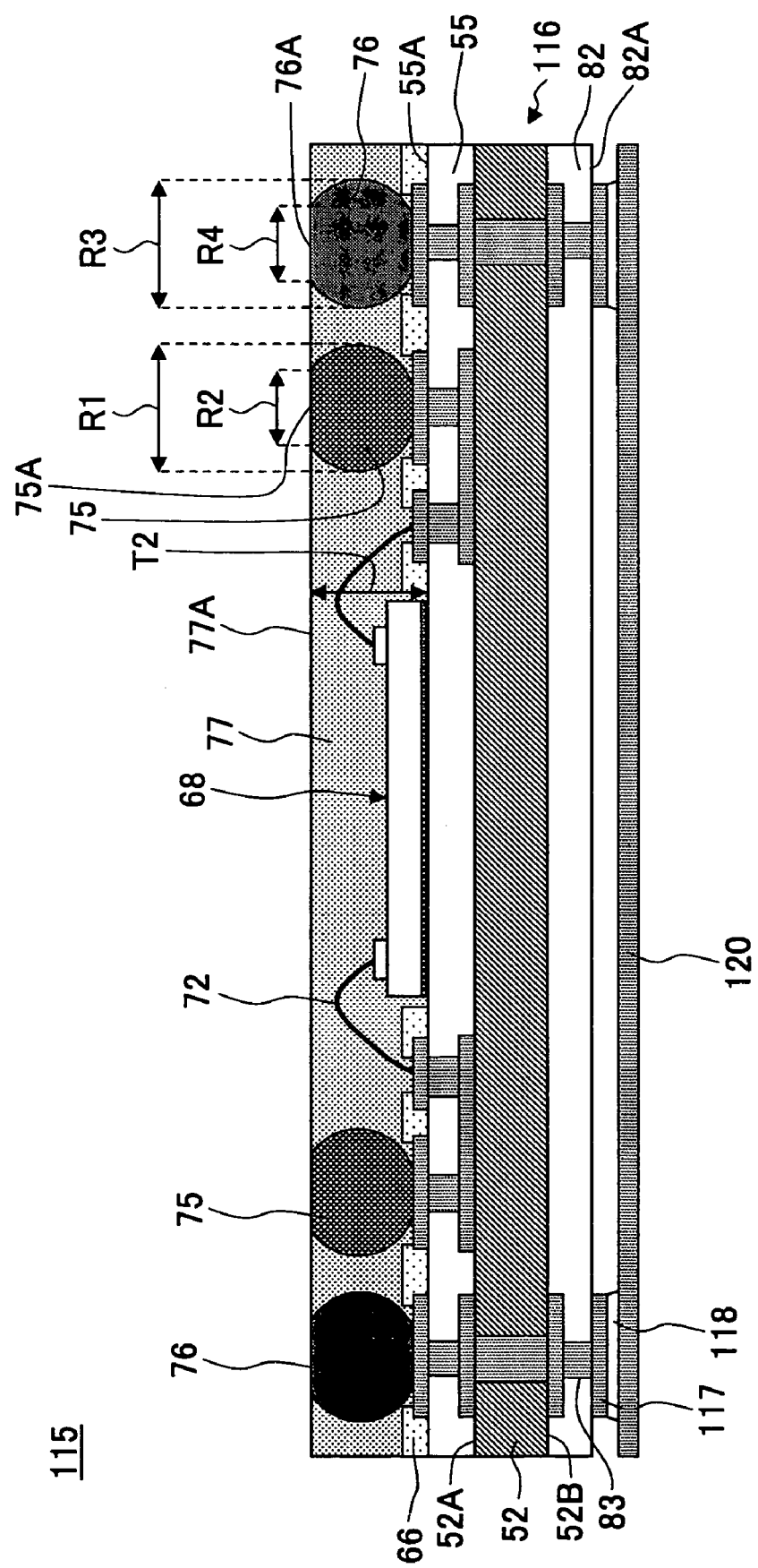
FIG. 4 shows a modified example of the semiconductor device of the first embodiment.

FIG. 4 shows a semiconductor device 115, which is a modified example of the semiconductor device 50 of the first embodiment. In FIG. 4, elements identical to those of the semiconductor device 50 shown in FIG. 2 are denoted by the same reference numerals. With reference to FIG. 4, the semiconductor device 115 generally comprises a board 116, a semiconductor chip 68, connection terminals 75, ground terminals 76, a transfer molded resin section 77, and a shield member 120. The board 116 is different from the board 51 in having connection pads 117. The connection pads 117 are disposed on a face 82A of a lower resin layer 82 and electrically connected to corresponding vias 83. The shield member 120 is a plate member having good conductivity. The shield member 120 is electrically connected to the connection pads 117 through corresponding applications of solder paste 118.

The shield member 120 may be made of nickel silver, for example. Nickel silver is a corrosion-resistant Cu—Ni—Zn alloy that can be easily flattened. The composition of the Cu—Ni—Zn alloy may be, for example, 62 wt % of CU, 14 wt % of Ni, and 24 wt % of Zn. The thickness of the shield member 120, if made of nickel silver, may range from 0.2 mm to 0.5 mm, for example.

The semiconductor device 115 with the configuration described above can achieve the same effects as the semiconductor device 50 of the first embodiment. The shield member 120 may be formed in a case-like shape that covers the side surface of the board 116. Forming the shield member 120 in a case-like shape can improve the shielding effect. Conductive adhesive may be used in place of applications of the solder paste 118.

A method for manufacturing the semiconductor device 50 of the first embodiment is described hereinafter with reference to FIGS. 5-8. FIGS. 5-8 illustrate a manufacturing process of the semiconductor device 50 of the first embodiment. In FIGS. 5-8, elements identical to those of the semiconductor device 50 shown in FIG. 2 are denoted by the same reference numerals. In FIG. 7, T4 represents the height of the transfer molded resin section 77 before grinding with reference to the upper face 55A of the upper resin layer 55 (hereinafter referred to as "thickness T4").

Figure 5:
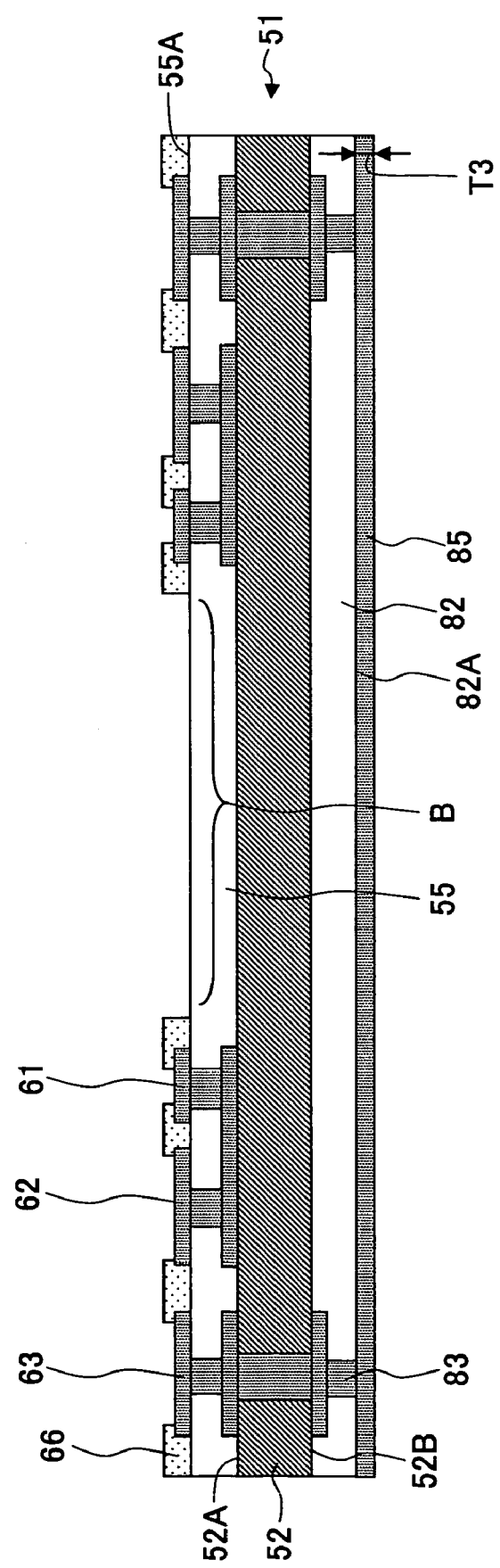
FIGS. 5-8 illustrate a manufacturing process of the semiconductor device of the first embodiment.

First, referring to FIG. 5, the board 51 and the shield member 85, which are described above with reference to FIG. 2, are formed by the same method as used for manufacturing a board in the related art. The shield member 85 is formed as a part of a wiring of the board 51 by, for example, a subtractive method or a semi-additive method when the wiring is formed on the board 51. The shield member 85 may be a copper foil or a metal layer such as copper plating layer. An Au layer may be formed as a protective film on the copper plating layer. The thickness T3 of the shield member 85 may range, for example, from 10 μm to 30 μm.

Figure 6:
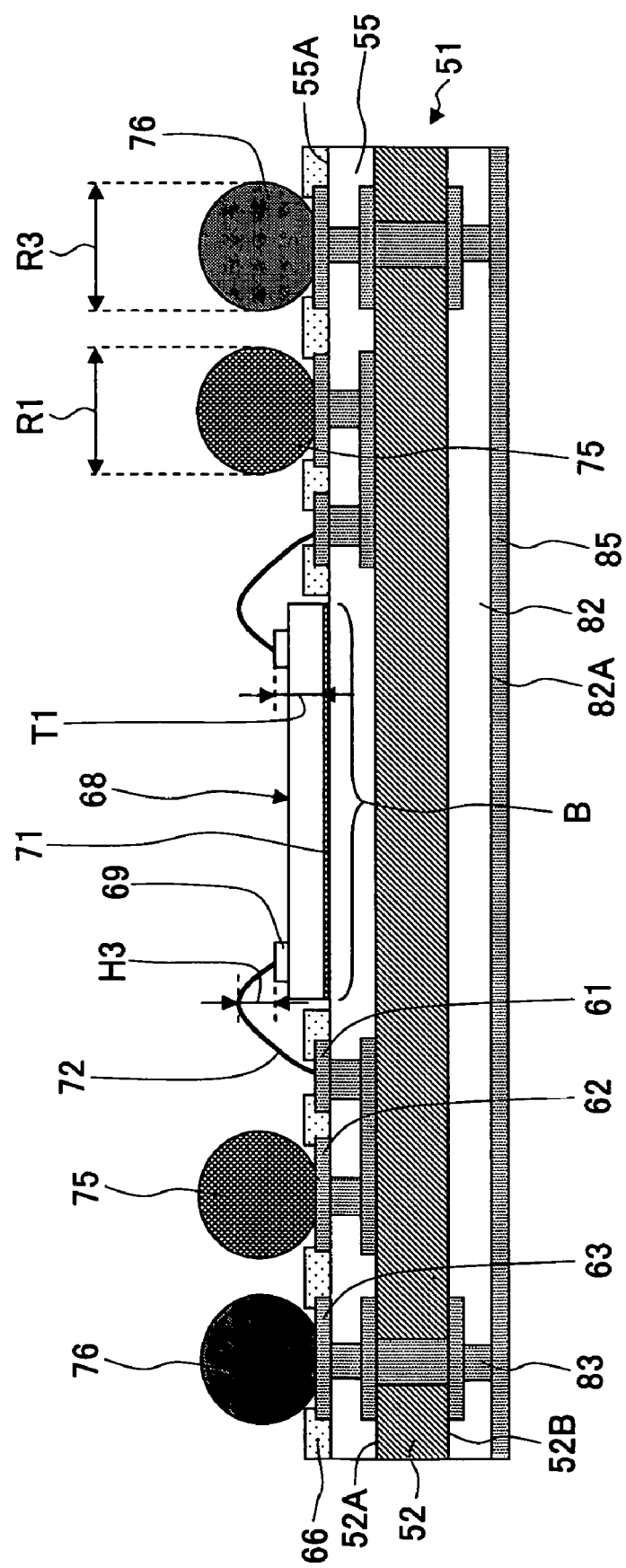
Figure 7:
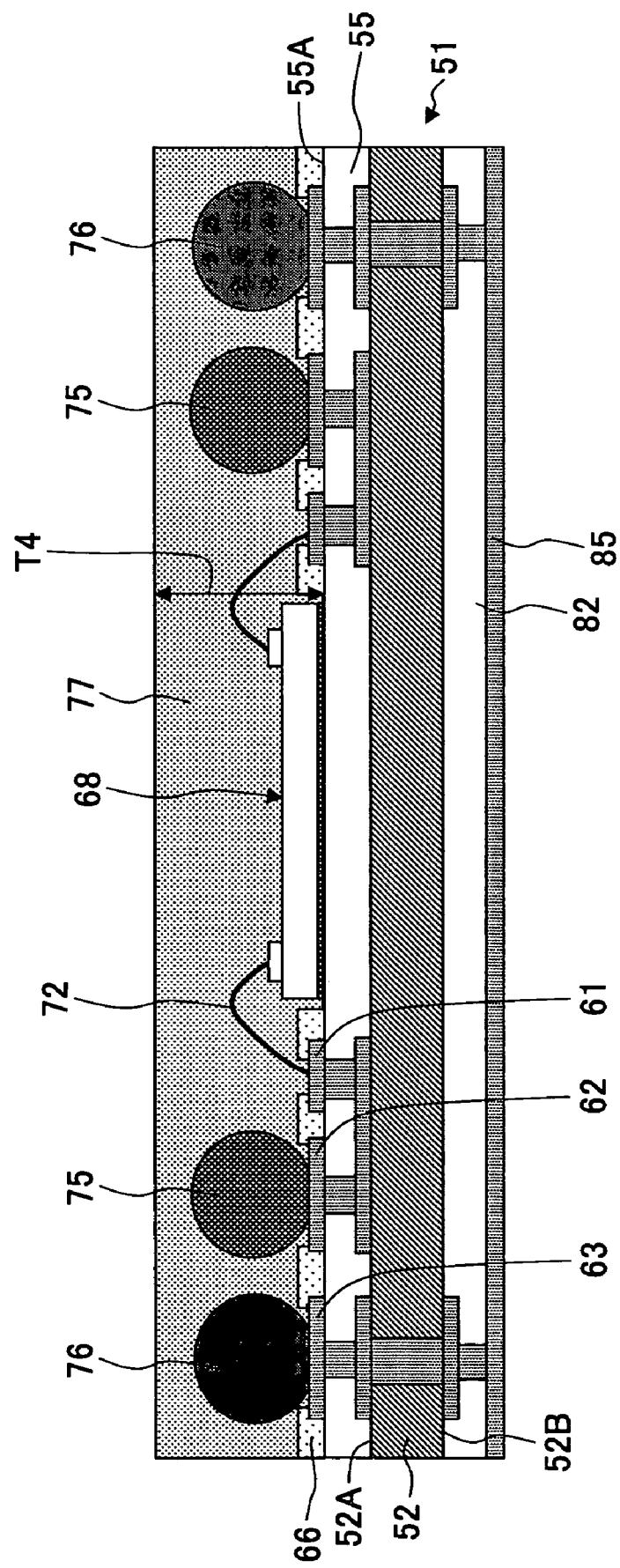

Then, referring to FIG. 6, the semiconductor chip 68 is disposed on a chip mount area B on the upper resin layer 55 through the adhesive 71. After that, the electrode pads 69 are connected to the corresponding wire connection portions 61 through the wires 72. Subsequently, the connection terminals 75 having generally spherical shapes formed of solder balls are disposed on the connection pads 62, and the ground terminals 76 having generally spherical shapes formed of solder balls are disposed on the corresponding connection pads 63. The flat faces 75A and 76A of the connection terminals 75 and the ground terminals 76 are not yet formed at this point. The thickness T1 of the semiconductor chip 68 may be, for example, 0.15 mm, and the height H3 of each wire 72 may be, for example, 0.1 mm. The diameter R1 of each connection terminal 75 may be, for example, 0.4 mm, and the diameter of each ground terminal 76 may be, for example, 0.4 mm.

Then, as shown in FIG. 7, the transfer molded resin section 77 is formed on the upper face side of the board 51 to cover the semiconductor chip 68, the wires 72, the connection terminals 75, and the ground terminals 76. The thickness T4 of the transfer molded resin section 77 is large enough to cover the connection terminals 75 and ground terminals 76 extending upward relative to the wires 72.

Figure 8:
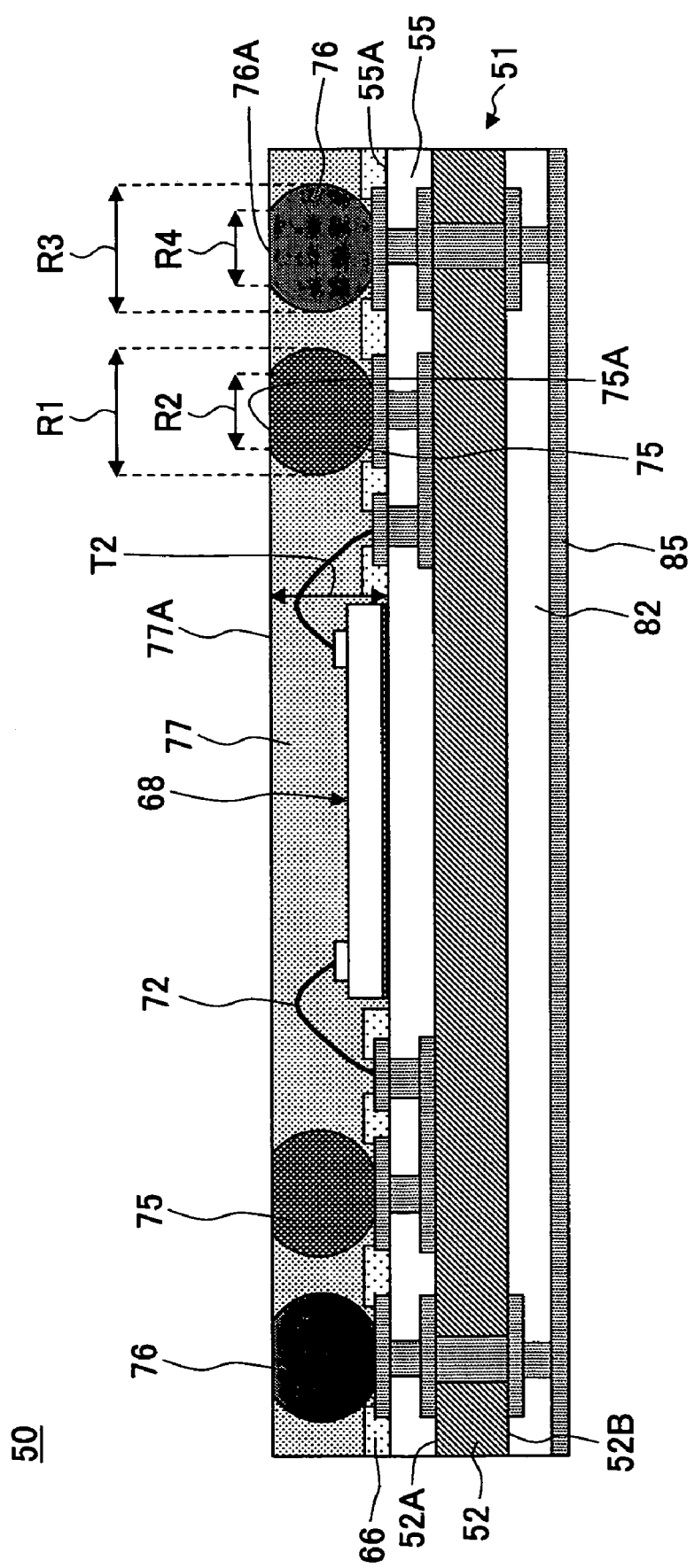

Then, referring to FIG. 8, the transfer molded resin section 77 is ground together with the connection terminals 75 and the ground terminals 76 to make the ground surface parallel to the substrate 52. Thus, the connection terminals 75 having the flat faces 75A and the ground terminals 76 having the flat faces 76A are formed. The semiconductor device 50 is manufactured in this way. The thickness T2 of the transfer molded resin section 77 after grinding may be, for example, 0.3 mm. The flat faces 75A of the connection terminals 75 and the flat faces 76A of the ground terminals 76 are substantially flush with the face 77A of the transfer molded resin section 77. Both the diameter R2 of each flat face 75A and the diameter R4 of the each flat face 76A may be, for example, 0.25 mm.

Second Embodiment

Figure 9:
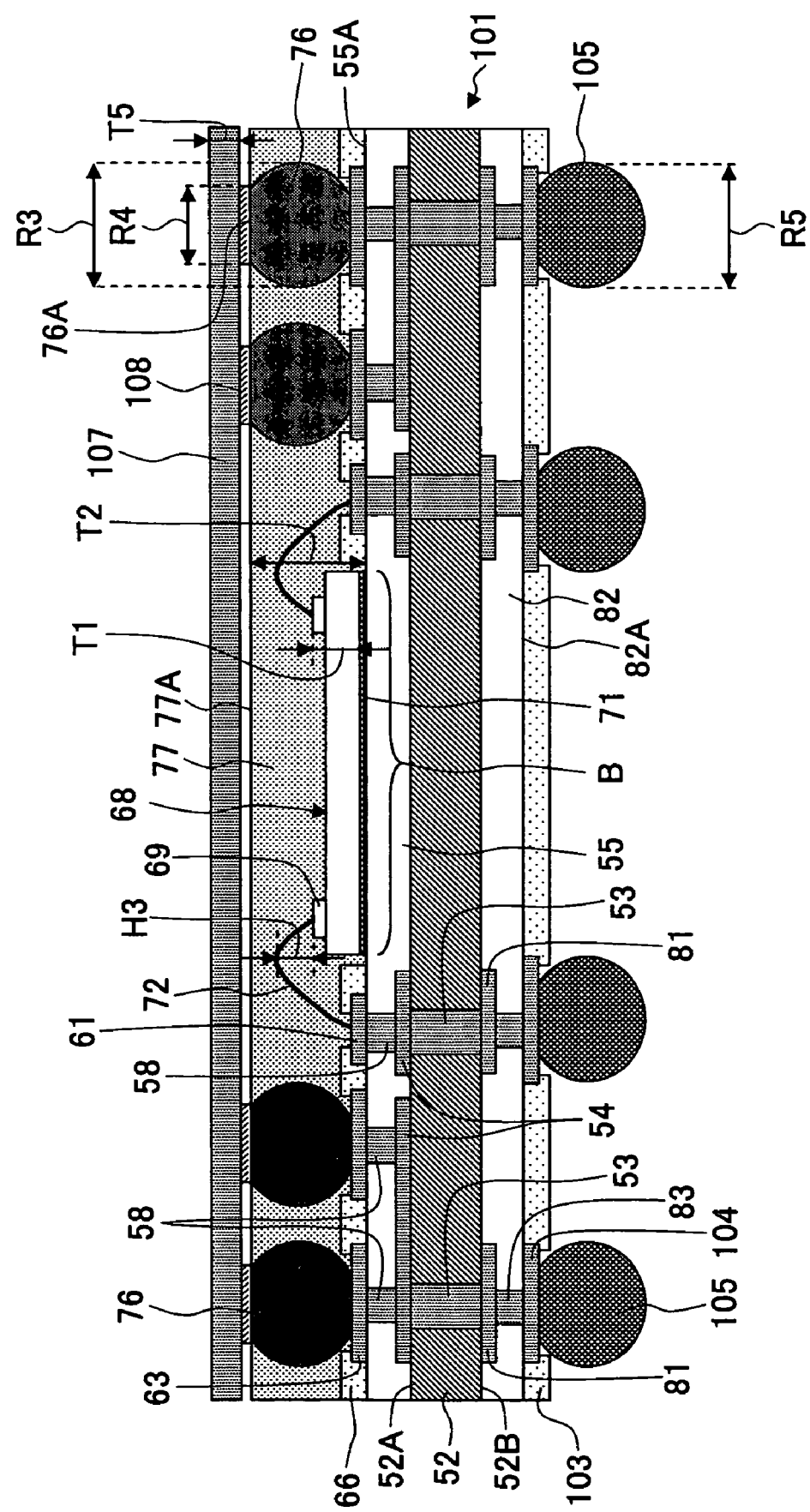
FIG. 9 is a cross-sectional view illustrating a semiconductor device according to a second embodiment of the present invention.

A semiconductor device 100 is described below with reference to FIG. 9 according to a second embodiment of the present invention. FIG. 9 is a cross-sectional view illustrating the semiconductor device 100 according to the second embodiment of the present invention In FIG. 9, elements identical to those of the semiconductor device 50 shown in FIG. 2 are denoted by the same reference numerals. In FIG. 9, T5 represents the height of a shield member 107 (hereinafter referred to as "thickness. T5").

The semiconductor device 100 generally comprises a board 101, a semiconductor chip 68, connection terminals 105, ground terminals 76, a transfer molded resin section 77, and the shield member 107.

The board 101 generally comprises a substrate 52, through vias 53, upper wiring portions 54, an upper resin layer 55, vias 58 and 83, wire connection portions 61, connection pads 63 and 104, solder resists 66 and 103, lower wiring portions 81, and a lower resin layer 82. The connection pads 104, on which the connection terminals 105 are disposed, are formed on a face 82A of the lower resin layer 82 and electrically connected to the corresponding vias 83. The solder resist 103 is formed on the lower resin layer 82, covering the face 82A of the lower resin layer 82 but exposing the connection pads 104. The connection pads 63 are formed on the upper resin layer 55 and connected to the corresponding vias 58.

The connection terminals 105 are generally spherical conductors and disposed on the corresponding connection pads 104. The connection terminals 105 are external connection terminals to be connected to another board such as a motherboard. The diameter R5 of each connection terminal 105 may be, for example, 0.4 mm. Non-exclusive examples of the connection terminal 105 include a solder ball and a metal post.

The ground terminals 76 are generally spherical conductors having ground potential and include flat faces 76A. The ground terminals 76 are disposed on the corresponding connection pads 63. The flat faces 76A of the ground terminals 76 are exposed from the transfer molded resin section 77 and flush with a face 77A of the transfer molded resin section 77.

The shield member 107 is electrically connected to the ground terminals 76 so as to reduce adverse effects of electromagnetic waves and the like. The shield member 107 is electrically connected to the faces 76A of the ground terminals 76 through applications of solder paste 108.

In this embodiment, the ground terminals 76 are disposed on the side (the upper face side of the board 101) opposite to the side (the lower face side of the board 101) on which the connection terminals 105 are disposed. This configuration can reduce the size of the board 101 and accordingly reduce the size of the semiconductor device 100. Moreover, this configuration can facilitate the mounting of the shield member 107 on the ground terminals 76.

Non-exclusive examples of the shield member 107 include a plate member having conductivity and a metal layer. The plate member having conductivity may be made of nickel silver, for example. Nickel silver is a corrosion-resistant Cu—Ni—Zn alloy that can be easily flattened. The composition of the Cu—Ni—Zn alloy may be, for example, 62 wt % of CU, 14 wt % of Ni, and 24 wt % of Zn. The thickness T5 of the shield member 107, if made of nickel silver, may range from 0.2 mm to 0.5 mm, for example.

If the shield member 107 is a metal layer, the shield member 107 can be electrically connected to the ground terminals 76 through conductive adhesive. The metal layer may be, for example, a copper foil or Cu plating layer. An Au layer may be formed as a protective film on the Cu plating layer. If the shield member 107 is a metal layer, the thickness T5 of the shield member 107 may range, for example, from 10 μm to 30 μm. In the semiconductor device 100, electronic components and other semiconductor chips (e.g. flip-chip connected semiconductor chips) may be mounted on one side of the board 101 on which the semiconductor chip 68 is mounted.

Figure 10:
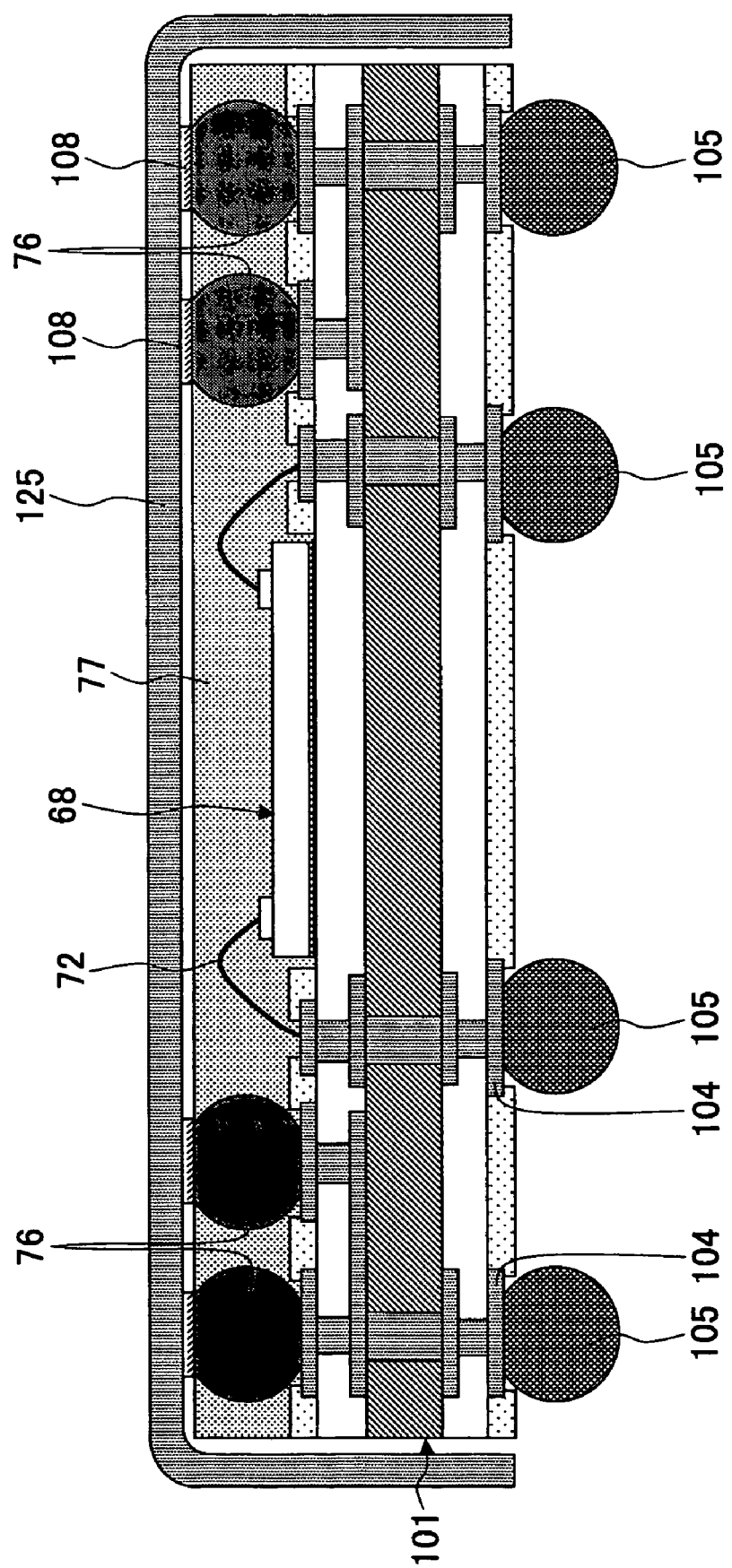
FIG. 10 shows a modified example of the semiconductor device of the second embodiment.

FIG. 10 shows a modified example of the semiconductor device 100 of the second embodiment. As shown in FIG. 10, a case-like shield member 125 that covers the side surface of the board 101 may be used in place of the shield member 107. The shield member 125 can achieve a higher shielding effect than the shield member 107. The shield member 125 may be made of nickel silver, for example. The nickel silver is a corrosion-resistant Cu—Ni—Zn alloy that can be easily flattened. The composition of the Cu—Ni—Zn alloy may be, for example, 62 wt % of CU, 14 wt % of Ni, and 24 wt % of Zn. The thickness of the shield member 125, if made of nickel silver, may range from 0.2 mm to 0.5 mm, for example.

A method for manufacturing the semiconductor device 100 of the second embodiment is described hereinafter with reference to FIGS. 11-16. FIGS. 11-16 illustrate a manufacturing process of the semiconductor device 100 of the second embodiment. In FIGS. 11-16, elements identical to those of the semiconductor device 100 shown in FIG. 9 are denoted by the same reference numerals.

Figure 11:
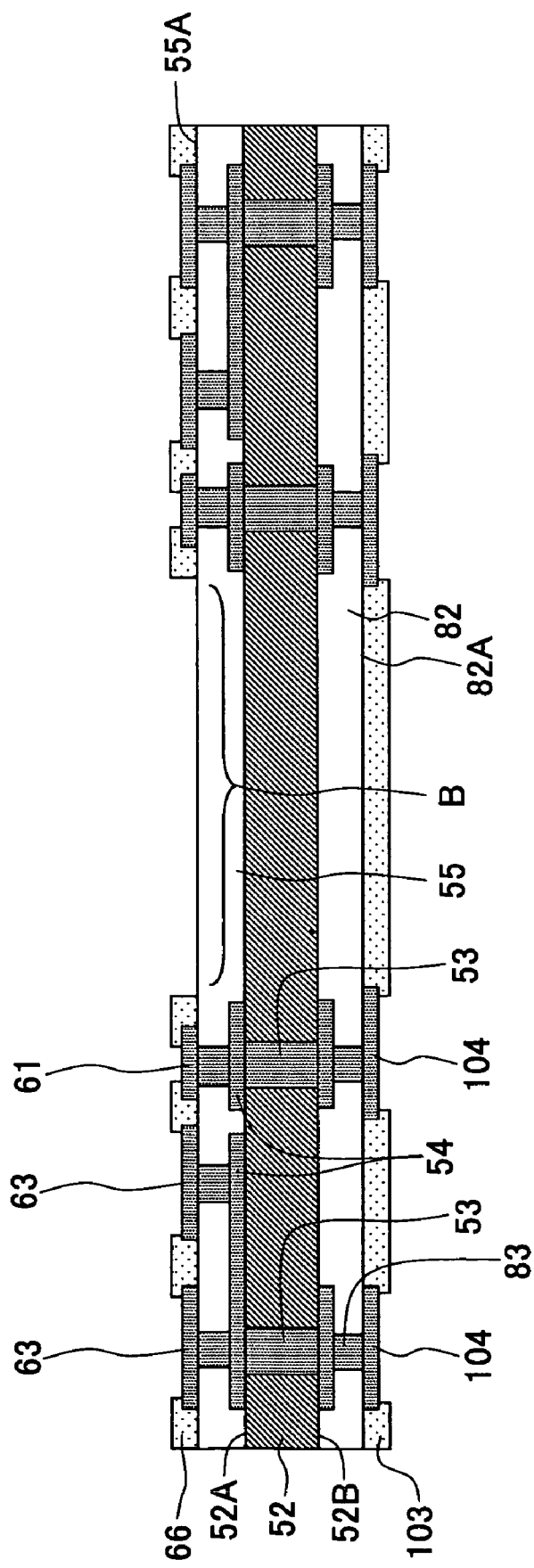
FIGS. 11-16 illustrate a manufacturing process of the semiconductor device of the second embodiment.

First, referring to FIG. 11, the board 101, which is described above with reference to FIG. 9, is formed by the same manufacturing method as used for manufacturing a board in the related art. The connection pads 63 are formed on a upper face 52A side of the substrate 52, while the connection pads 104 are formed on a lower face 52B side of the substrate 52.

Figure 12:
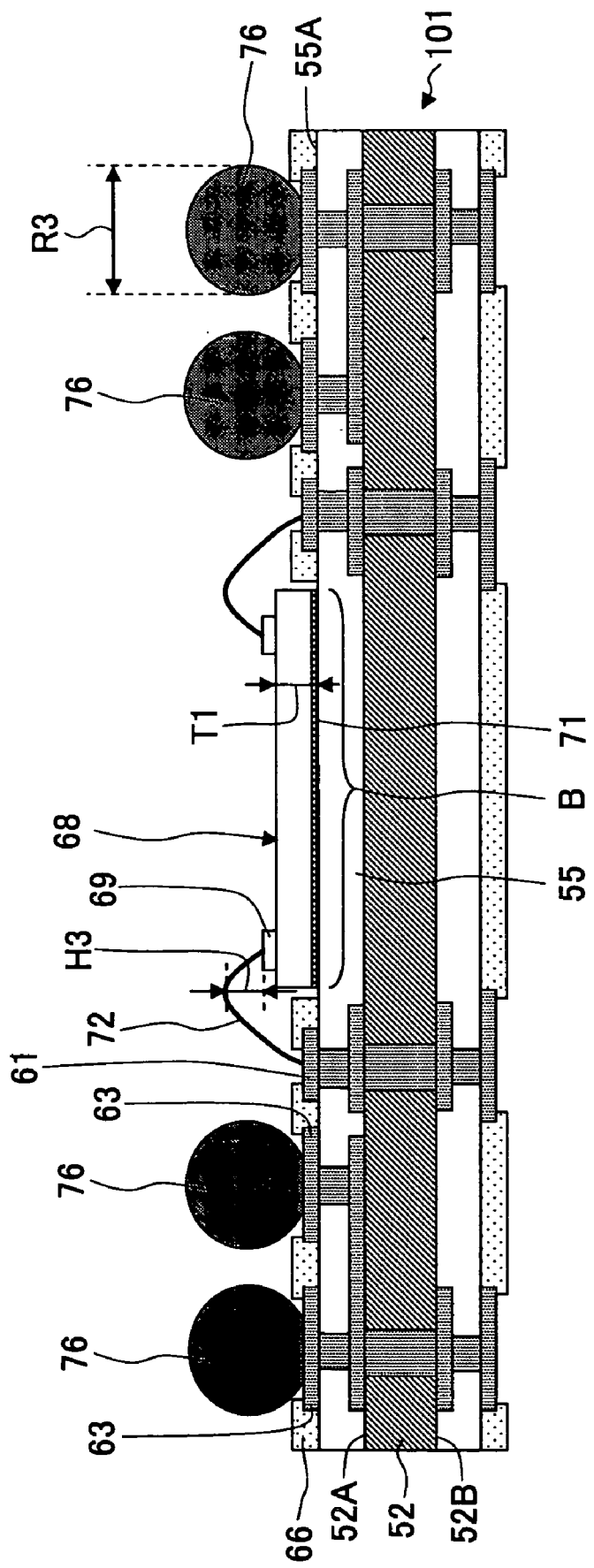

Then, referring then to FIG. 12, the semiconductor chip 68 is disposed on a chip mount area B on the upper resin layer 55 through an adhesive 71. After that, electrode pads 69 are connected to the corresponding wire connection portions 61 through wires 72. The ground terminals 76 having generally spherical shapes are disposed on the corresponding connection pads 63. The flat faces 76A of the ground terminals 76 are not yet formed at this point. The thickness T1 of the semiconductor chip 68 may be, for example, 0.15 mm, and the height H3 of each wire 72 may be, for example, 0.1 mm. The diameter R3 of each ground terminal 76 may be, for example, 0.4 mm.

Figure 13:
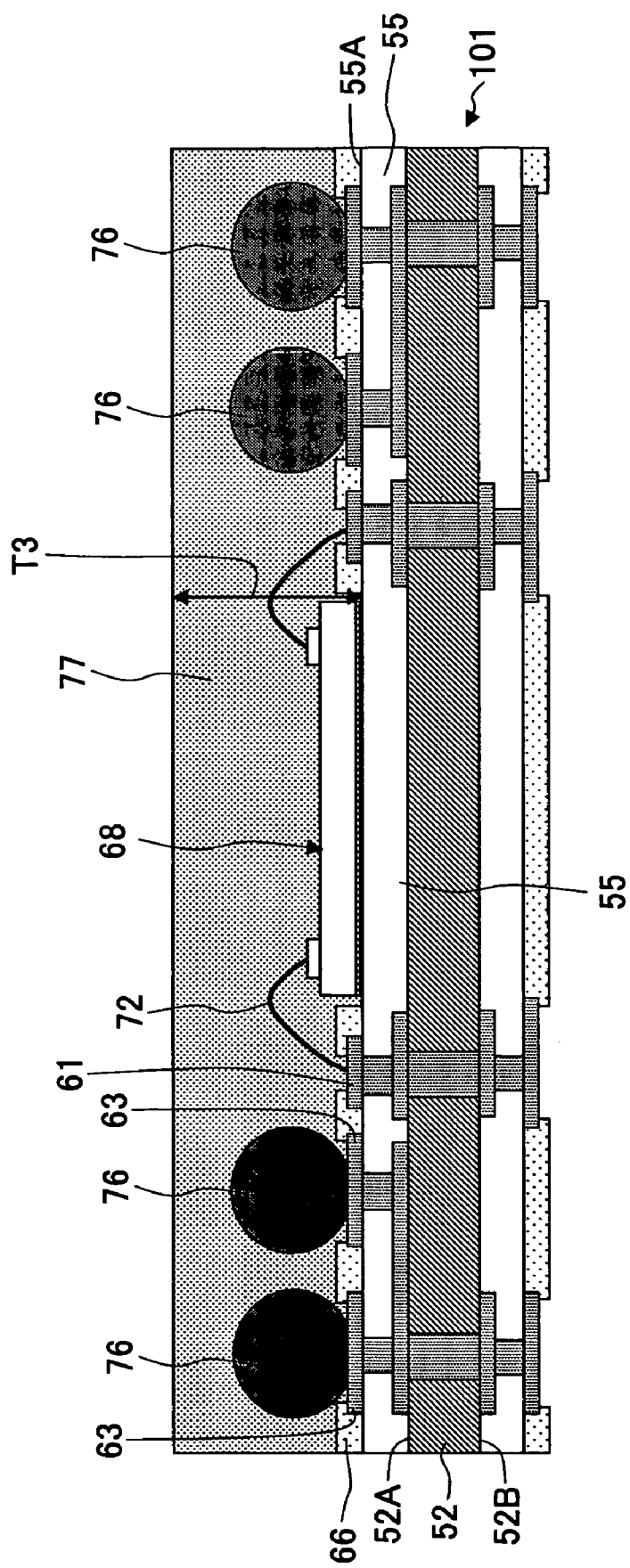

Then, as shown in FIG. 13, the transfer molded resin section 77 is formed on the upper face side of the board 101 to cover the semiconductor chip 68, the wires 72, and the ground terminals 76. The thickness T3 of the transfer molded resin section 77 is large enough to cover the ground terminals 76 extending upward relative to the wires 72.

Figure 14:
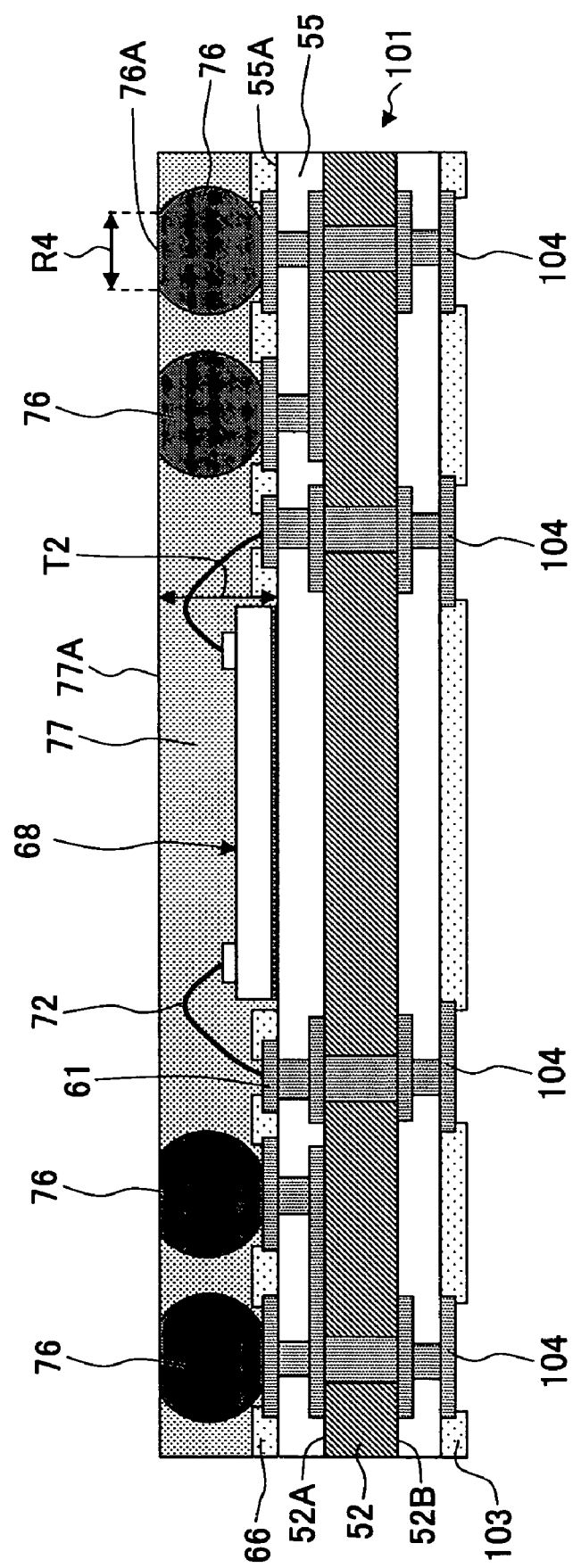

Then, referring to FIG. 14, the transfer molded resin section 77 is ground together with the ground terminals 76 to make the ground surface parallel to the substrate 52. Thus, the ground terminals 76 are exposed from the transfer molded resin section 77 and the flat faces 76A are formed in the ground terminals 76. The thickness T2 of the transfer molded resin section 77 after grinding may be, for example, 0.3 mm. The flat faces 76A of the ground terminals 76 are substantially flush with the face 77A of the transfer molded resin section 77. The diameter R4 of the flat face 76A of each ground terminal 76 may be, for example, 0.25 mm.

Figure 15:
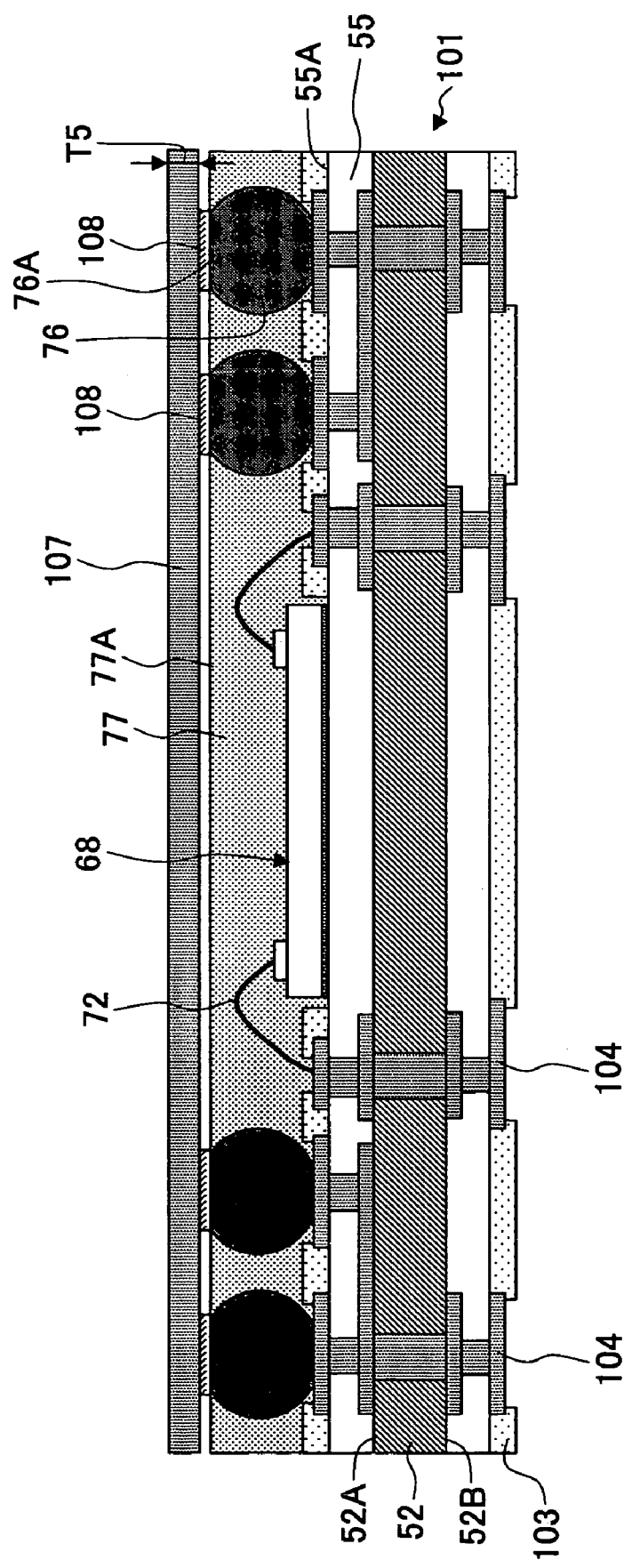
Figure 16:
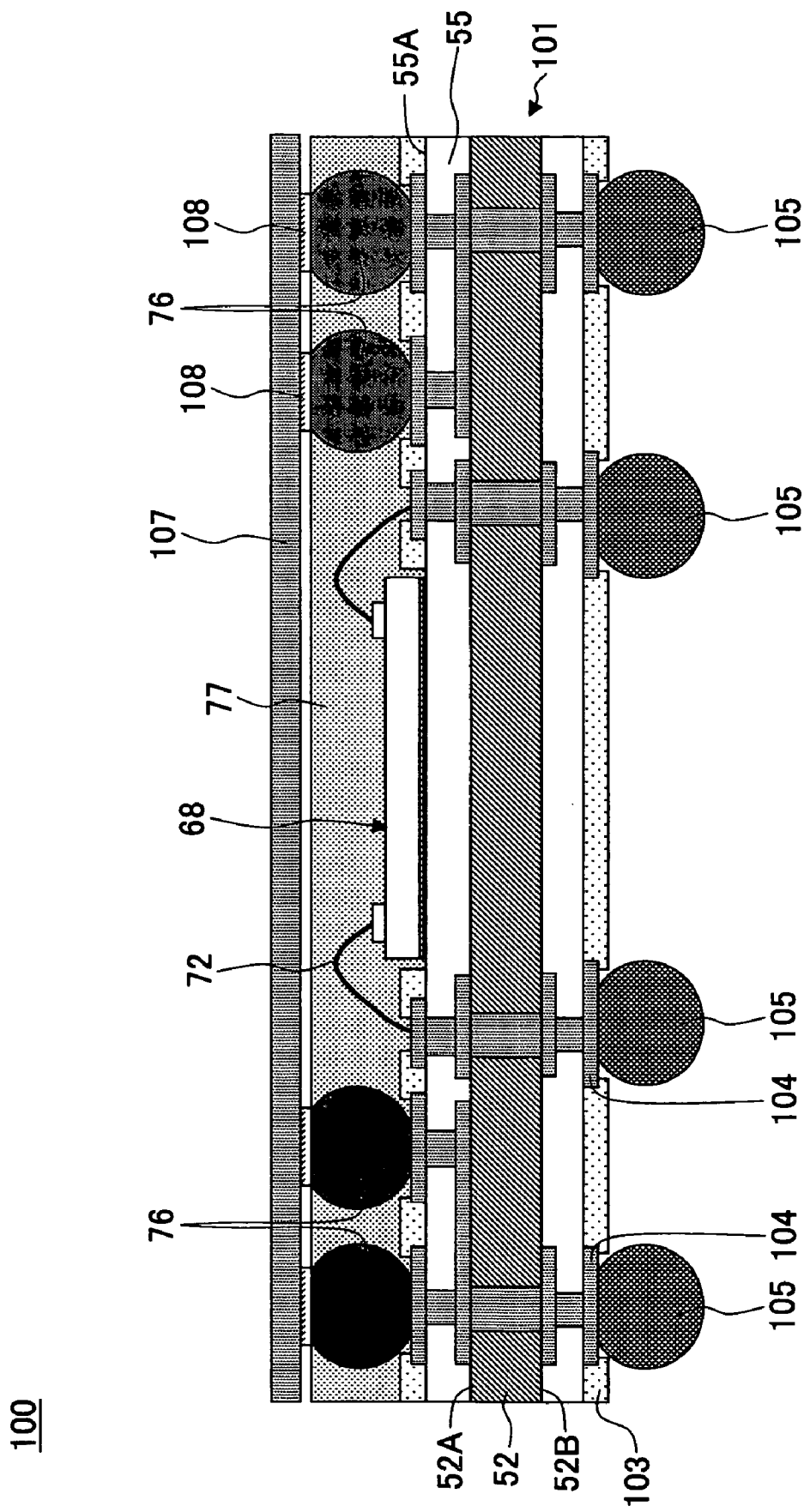

Then, as shown in FIG. 15, the shield member 107 is connected to the ground terminals 76 through application of the solder paste 108. After that, the connection terminals 105 are disposed on the connection pads 104 as shown in FIG. 16. The semiconductor device 100 is manufactured in this way.

While the present invention has been described in terms of preferred embodiments, it will be apparent to those skilled in the art that variations and modifications may be made without departing from the scope of the invention as set forth in the accompanying claims.

The present application is based on Japanese Priority Application No. 2005-000714 filed on Jan. 5, 2005, with the Japanese Patent Office, the entire contents of which are hereby incorporated by reference.

What is claimed is:

1. A semiconductor device comprising:
  a board;
  a ground terminal disposed on the board;
  a connection terminal disposed on the board;
  a semiconductor chip mounted on the board; and
  a shield member electrically connected to the ground terminal;
  wherein the semiconductor chip, the ground terminal, and the connection terminal are disposed on one side of the board; and
  the shield member is disposed directly on and covers the other side of the board.

2. The semiconductor device as claimed in claim 1,
  wherein the semiconductor chip is covered with a transfer molded resin section; and
  the ground terminal and the connection terminal are exposed from the transfer molded resin section.

3. The semiconductor device as claimed in claim 2,
  wherein the ground terminal and the connection terminal have flat faces exposed from the transfer molded resin section; and
  the flat faces of the ground terminal and the connection terminal are substantially flush with a face of the transfer molded resin section.

4. A semiconductor device comprising:
  a board;
  a ground terminal disposed on the board;
  a connection terminal disposed on the board;
  a semiconductor chip mounted on the board; and
  a shield member;
  wherein the connection terminal is disposed on one side of the board while the ground terminal is disposed on the other side of the board; and
  the shield member is disposed on the ground terminal.

5. The semiconductor device as claimed in claim 4,
  wherein the semiconductor chip is covered with a transfer molded resin section; and
  the ground terminal is exposed from the transfer molded resin section.

6. The semiconductor device as claimed in claim 5,
  wherein the ground terminal has a flat face exposed from the transfer molded resin section; and
  the flat face of the ground terminal is substantially flush with a face of the transfer molded resin section.

* * * * *